United States Patent

Juneja et al.

[11] Patent Number: 6,127,728
[45] Date of Patent: Oct. 3, 2000

[54] SINGLE REFERENCE PLANE PLASTIC BALL GRID ARRAY PACKAGE

[75] Inventors: Nitin Juneja; Aritharan Thurairajaratnam, both of Fremont, Calif.

[73] Assignee: LSI Logic Corporation, Milpitas, Calif.

[21] Appl. No.: 09/344,178

[22] Filed: Jun. 24, 1999

[51] Int. Cl.$^7$ .................................................. H01L 23/12
[52] U.S. Cl. .................. 257/700; 257/702; 257/737; 257/738; 257/774; 257/782; 361/760; 361/762; 361/764
[58] Field of Search .................................... 257/700, 702, 257/737, 738, 723, 724, 782, 783, 773, 774; 361/760, 762, 764, 765, 783

[56] References Cited

U.S. PATENT DOCUMENTS

| | | | |
|---|---|---|---|
| 4,965,594 | 10/1990 | Komuro | 346/140 |
| 5,036,163 | 7/1991 | Spielberger et al. | 174/52.4 |
| 5,303,119 | 4/1994 | Hilbrink | 361/749 |
| 5,468,999 | 11/1995 | Lin et al. | 257/784 |
| 5,500,555 | 3/1996 | Ley | 257/700 |
| 5,808,873 | 9/1998 | Celaya et al. | 361/760 |
| 5,886,406 | 3/1999 | Bhansali | 257/698 |
| 6,064,113 | 5/2000 | Kirkman | 257/691 |

*Primary Examiner*—John Guay
*Assistant Examiner*—Alonzo Chambliss

[57] ABSTRACT

A semiconductor package is disclosed. According to one embodiment, the package comprises a substrate having a top surface with traces thereon and a bottom surface with solder balls thereon, the substrate comprising at least three material layers defining at least four substantially planar metal layers, wherein one of the metal layers comprises a reference layer that serves as a reference to both traces on a metal layer above the reference layer and traces on a metal layer below the reference layer. A semiconductor die is mounted to the substrate and bonding wires electrically connect the semiconductor die to the traces on the top surface of the substrate. The traces on the top surface of the substrate are electrically connect to the solder balls through vias and possibly through routing on another metal layer.

1 Claim, 3 Drawing Sheets

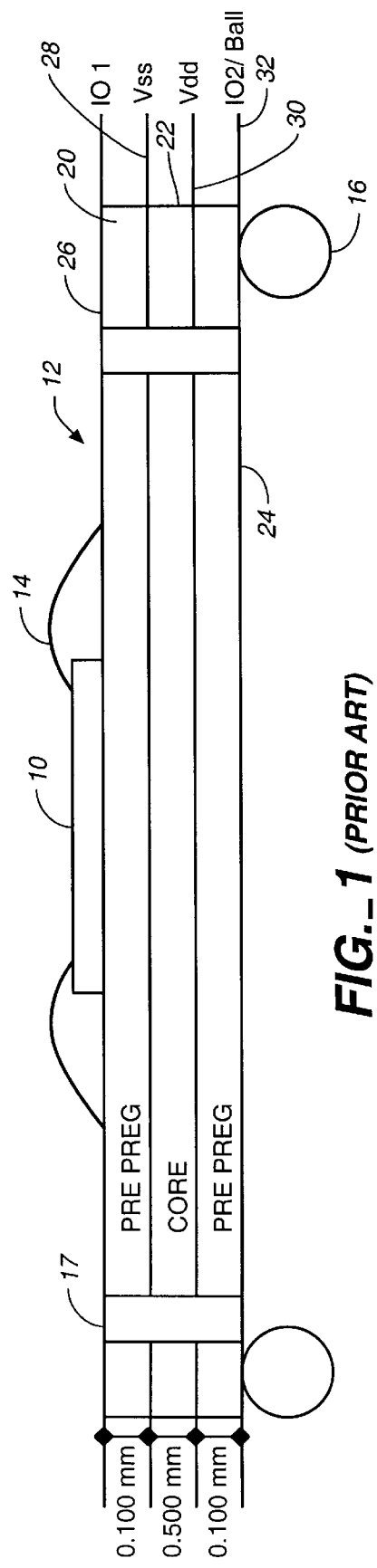
FIG._1 *(PRIOR ART)*
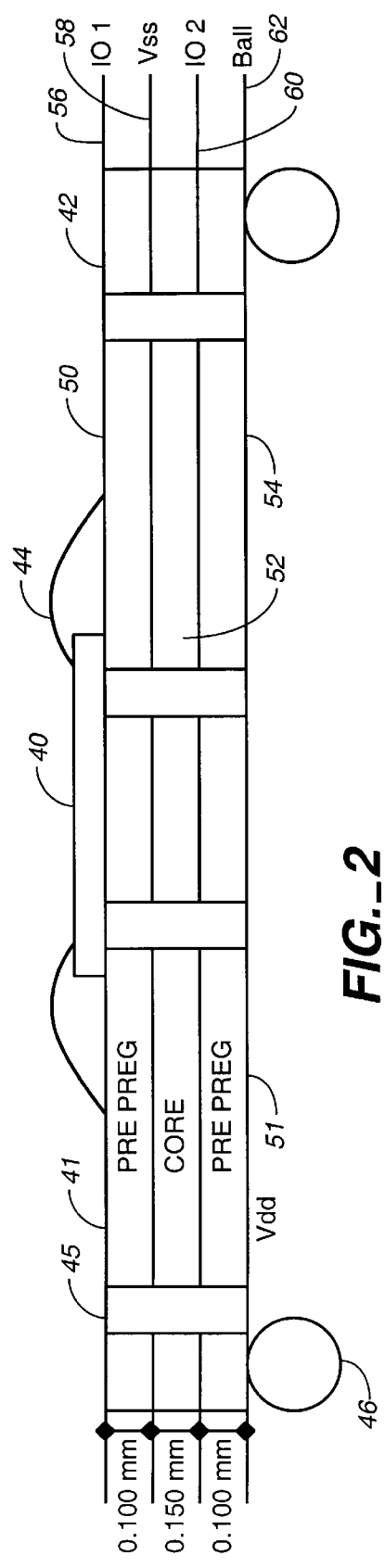
FIG._2

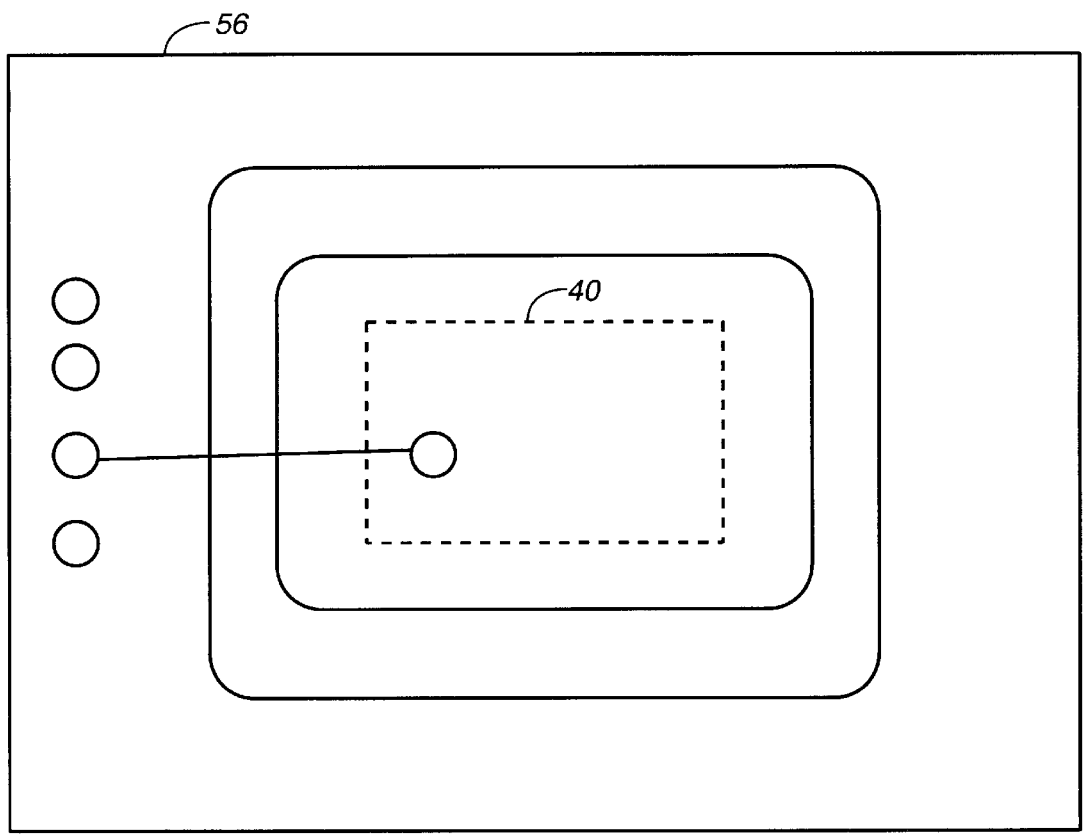
FIG._3a
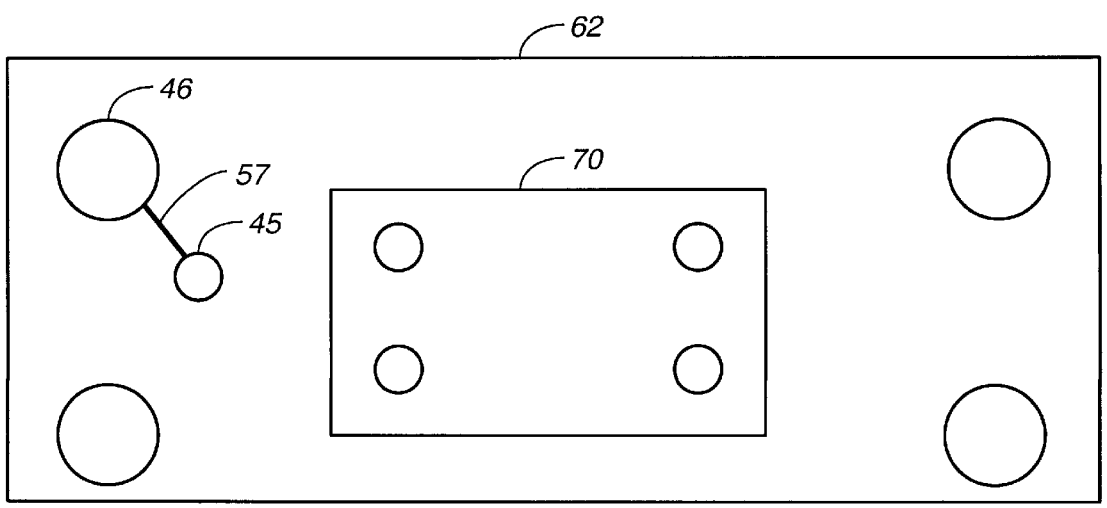
FIG._4

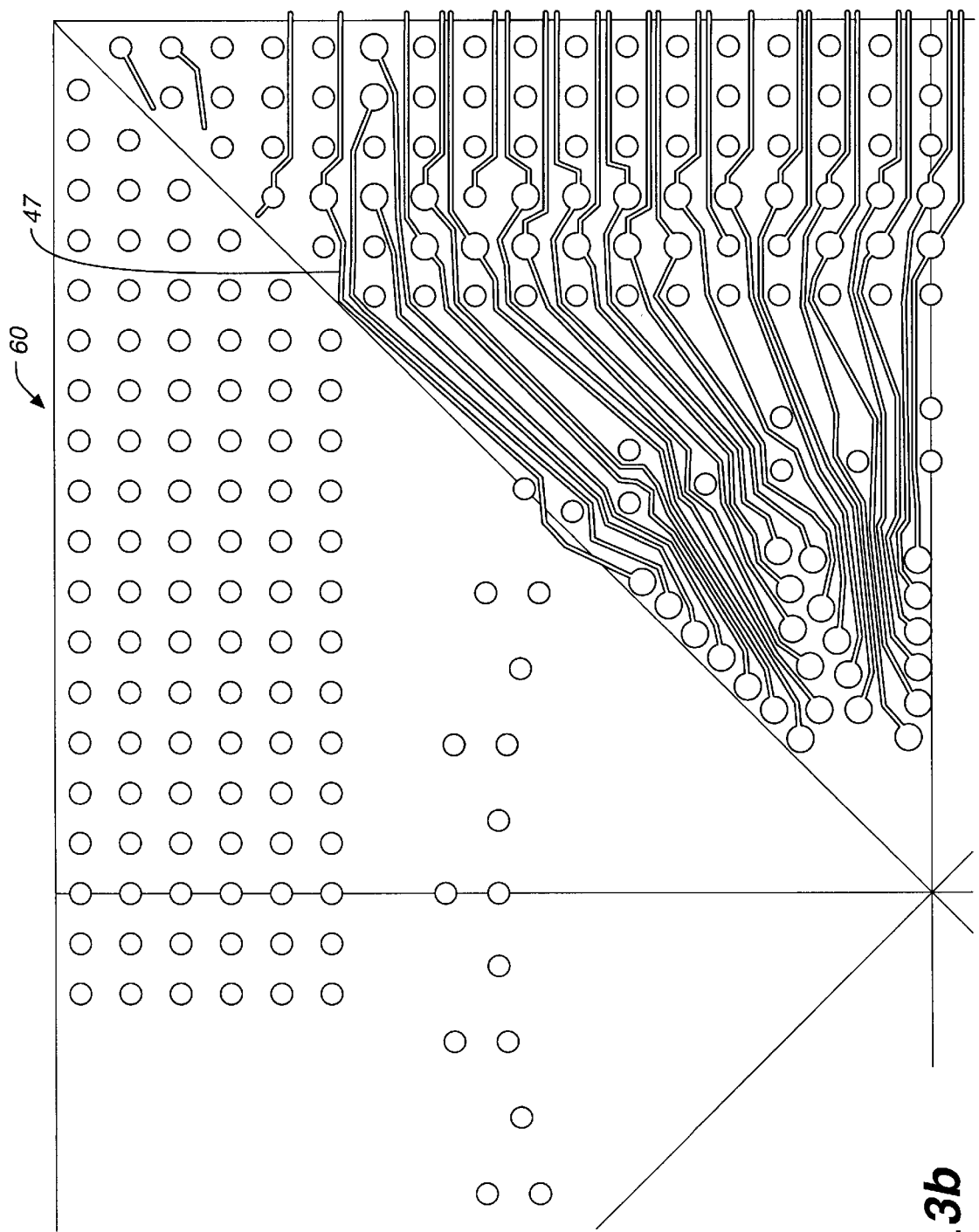
FIG._3b

SINGLE REFERENCE PLANE PLASTIC BALL GRID ARRAY PACKAGE

BACKGROUND OF THE INVENTION

1. Field of the Invention

This invention relates to the packaging of semiconductor devices, and in particular to a ball grid array (BGA) package.

2. Description of the Related Art

BGA packages for semiconductor devices are becoming increasingly common. A cross-section of one conventional plastic BGA (PBGA) package is illustrated in FIG. 1. As shown, the package comprises a semiconductor device 10 mounted on a substrate 12 and electrically connected to traces (not shown) on the substrate 12 through bonding wires 14. Solder balls 16 serve to mount the package to a printed circuit board. The traces are connected to the solder balls 16 through vias 17 in the substrate. The substrate 12 comprises three material layers 20, 22 and 24, which comprise pre-preg, a core which is typically BT resin and pre-preg, respectively; the pre-preg thickness is approximately 0.100 mm while the core thickness is approximately 0.500 mm.

The three material layers 20, 22 and 24 define four metal layers, 26, 28, 30 and 32,. Layer 26 comprises a plurality of traces for signal input/output (I/O) and layer 28 comprises a metal plane which serves as a reference (ground) to the traces on layer 26. The traces on layer 26 may also be routed underneath the die. All of the traces on layer 26, whether or not routed underneath the die, are connected by vias to layer 32, where signal traces connect vias to the desired solder balls. Layer 30 comprises a partial ground plane and a partial power plane wherein the partial ground plane serves as a reference to the traces on layer 32. (The partial ground plane is generally directly above the traces for which it is serving as a reference while the power plane may be, for example, a ring that surrounds the ground plane and is not directly above any of those traces.)

It is desirable to improve upon various characteristics package illustrated in FIG. 1. In particular, traces on the layer 32 must be grouped together and can only be routed in areas where it is possible to provide a reference plane above on layer 30; these restrictions decrease the available amount of routing space.

SUMMARY OF THE INVENTION

These and other needs are met by the present invention, which comprises a package with multiple routing layers. In particular, according to one embodiment, the present invention comprises a substrate having a top surface with traces thereon and a bottom surface with solder balls thereon, the substrate comprising at least three material layers defining at least four substantially planar metal layers, wherein one of the metal layers comprises a reference layer that serves as a reference to both traces on a routing metal layer above the reference layer and traces on a routing metal layer below the reference layer. A semiconductor die is mounted to the substrate and bonding wires electrically connect the semiconductor die to the traces on the top surface of the substrate. The traces on the top surface of the substrate are electrically connected to the solder balls through vias and possibly through routing on another metal layer.

Since a single layer serves as a reference to two trace routing layers, an additional reference layer is not necessary, which frees up routing space.

BRIEF DESCRIPTION OF THE DRAWINGS

Other objects and advantages of the invention will become apparent upon reading the following detailed description and upon reference to the accompanying drawings in which:

FIG. 1 is a cross section of a conventional PBGA package.

FIG. 2 is a cross section of an exemplary PBGA package according to the present invention.

FIGS. 3a and 3b, respectively, show exemplary traces on different metal layers of the package illustrated in FIG. 2.

FIG. 4 shows an exemplary bottom metal layer of the package illustrated in FIG. 2.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

The present invention pertains to BGA packages. Although the preferred embodiment is described with reference to a PBGA package, it will be appreciated that the present invention has applicability to any type of multi-layered BGA package. Further, the present invention may be practiced with different materials and thicknesses than the particular materials and thicknesses described herein.

FIG. 2 illustrates an example of a package constructed in accordance with the present invention. As shown, the package comprises a semiconductor die 40 mounted on a top surface 41 of a substrate 42 and electrically connected to traces 43 (see FIG. 3a) on the substrate 42 through bonding wires 44. The bonding wires 44 also connect the semiconductor device 40 to power and ground rings on the top surface 41 of the substrate 42. Solder balls 46 on a bottom surface 51 of the substrate 42 serve to mount the package to a printed circuit board. Vias 45 running through the substrate 42 electrically connect elements (e.g. traces, solder balls) on one layer to elements on another layer. (Only two of the vias 45 are shown for the purposes of clarity.) The traces 43 are connected to the solder balls 46.

In the preferred embodiment, the substrate 42 comprises three material layers 50, 52 and 54, which comprise pre-preg, a BT resin core and pre-preg, respectively. In the preferred embodiment, the pre-preg thickness is approximately 0.100 mm while the core thickness is approximately 0.150 mm.

The three material layers 50, 52 and 54 define four metal layers, 56, 58, 60 and 62. The traces 43 on layer 56 are preferably routed both around and underneath the semiconductor die 40 as shown in FIG. 3a. The traces 43 on layer 56 are connected by certain of the vias 45 to traces 47 on layer 60. The traces 47 on layer 60 are on the material layer 52 and are appropriately routed (see, for example, FIG. 3b). Certain of the vias 45 connect the traces 47 to preferably short traces 57 on layer 62 (see FIG. 4), which connect vias 45 with corresponding solder balls 46. Layer 58 comprises a ground plane, preferably a sheet of metal such as copper, which serves as a reference to the traces on layer 56 and traces on layer 60. Layer 58 is connected by certain of the vias 45 to a ground ring on layer 56. To control the impedance of the package, the traces 47 on layer 60 should preferably be widened compared to the traces 43 on layer 56. For example, if a typical trace on layer 56 is 0.090 mm wide, a typical trace on layer 60 should preferably be approximately 0.120 mm wide.

Layer 62 comprises a power plane 70 as shown in FIG. 4. The power plane on layer 62 is connected by certain of the vias 45 to a power ring on layer 56.

FIGS. 3*a* and 3*b*, respectively, show exemplary traces on layers 56 and 60.

Numerous variations and modifications will become apparent to those skilled in the art once the above disclosure is fully appreciated. It is intended that the following claims be interpreted to embrace all such variations and modifications.

What is claimed is:

1. A semiconductor package, comprising:

a substrate having a top surface with traces thereon and a bottom surface with solder balls thereon, the substrate comprising first, second and third material layers and first, second, third and fourth metal layers, wherein the first and third metal layers comprise traces and wherein the second metal layer is in between the first and third metal layers; and wherein the second metal layer comprises a reference layer that serves as a reference to both traces on the first and third metal layers, a semiconductor die mounted on the substrate;

bonding wires that electrically connect the semiconductor die the traces on the top surface of the substrate wherein the traces on the top surface of the substrate are electrically connected to the solder balls; wherein the substrate has exactly three material layers and four metal layers;

the first metal layer is the top surface of the substrate, wherein the traces comprising the first metal layer are routed underneath the die, wherein the traces comprising the first metal layer are connected by vias to the traces comprising the third metal layer, and wherein the traces comprising the third metal layer are connected by vias to the solder balls; and wherein at least one of the traces comprising the first metal layer is approximately 0.090 mm wide and wherein at least one of the traces comprising the third metal layer is approximately 0.120 mm wide.

* * * * *